United States Patent
Yao (10) Patent No.: US 7,030,706 B2
(45) Date of Patent: Apr. 18, 2006

(54) SELF-CALIBRATABLE OSCILLATING DEVICE AND METHOD AND ASIC THEREOF

(75) Inventor: Chung Ting Yao, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 61 days.

(21) Appl. No.: 10/728,382

(22) Filed: Dec. 5, 2003

(65) Prior Publication Data

US 2005/0122182 A1 Jun. 9, 2005

(51) Int. Cl.
*H03B 5/32* (2006.01)
(52) U.S. Cl. .................. 331/44; 331/158; 331/176
(58) Field of Classification Search ............. 331/44, 331/66, 176, 160
See application file for complete search history.

(56) References Cited

U.S. PATENT DOCUMENTS 5,172,075 A * 12/1992 Yerbury et al. ............. 331/14
5,892,408 A * 4/1999 Binder ....................... 331/44
5,912,595 A * 6/1999 Ma et al. ................. 331/117 D

FOREIGN PATENT DOCUMENTS

CN 373389 11/1999
CN 397307 7/2000

* cited by examiner

*Primary Examiner*—Joseph Chang
(74) *Attorney, Agent, or Firm*—Egbert Law Offices (57) ABSTRACT

The present self-calibratable oscillating device includes a phase comparator, a clock pad electrically connected to a first input port of the phase comparator, a crystal oscillator electrically connected to a second input port of the phase comparator, an analog/digital converter electrically connected to an output port of the phase comparator, and a memory electrically connected to an output port of the analog/digital converter. The crystal oscillator can be a temperature-compensated crystal oscillator or a surface acoustic wave crystal oscillator. The present self-calibratable oscillating device can further includes a first switch positioned between the first input port of the phase comparator and the clock pad, a second switch positioned between the crystal oscillator and the clock pad wherein the stream direction of the first switch is in reverse of that of the second switch, and a logic control device for controlling the first switch and the second switch.

6 Claims, 7 Drawing Sheets

FIG. 7

SELF-CALIBRATABLE OSCILLATING DEVICE AND METHOD AND ASIC THEREOF

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to an oscillating device, and more particularly, to a self-calibratable oscillating device, which can shorten the calibration time to lower the total test cost.

BACKGROUND OF THE INVENTION

Oscillating devices are generally applied to electronics that require a stable output frequency, such as mobile phones. Such oscillating device mostly incorporates an AT-cut crystal oscillator in a frequency band of 10 MHz as the oscillation source to constitute an oscillation circuit. Because the output frequency of the AT-cut crystal oscillator varies with the environmental temperature, it is necessary in practice to design a temperature compensation circuit for eliminating the frequency variation of the AT-cut crystal oscillator.

Figure 1:
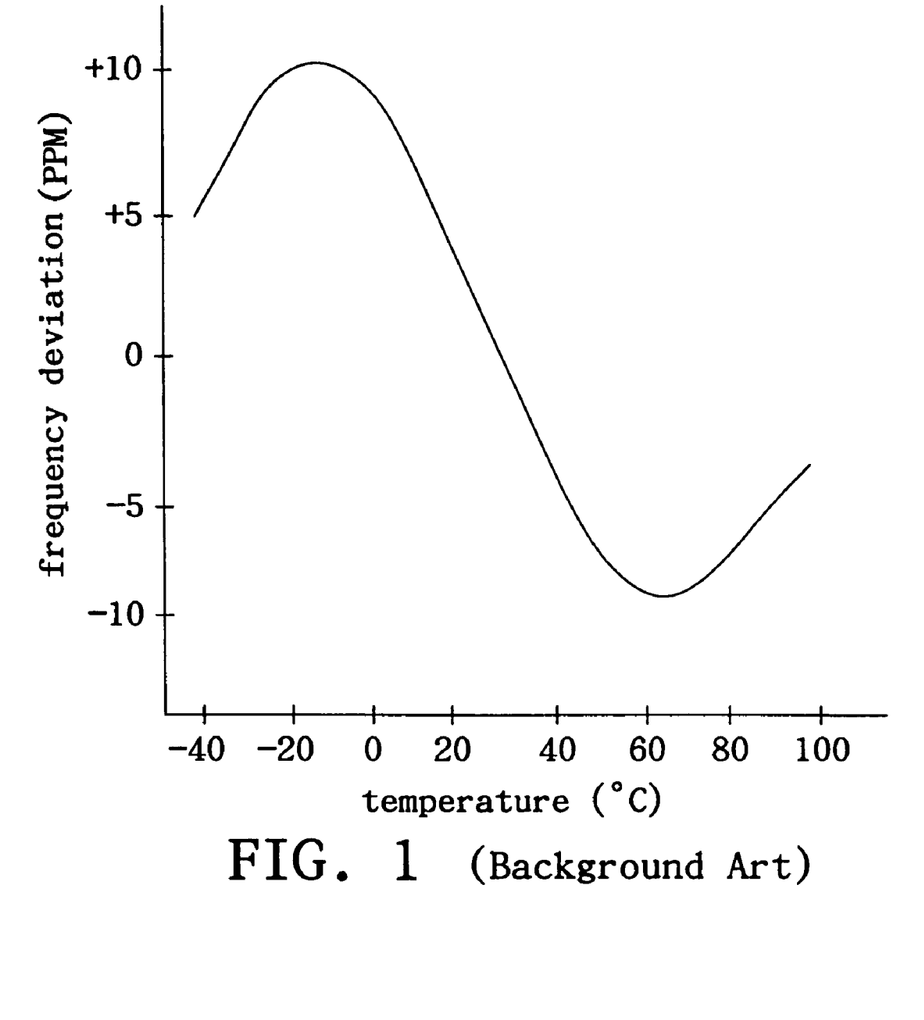
FIG. 1 is a graph illustration showing the relation between the frequency deviation of an AT-cut crystal oscillator and the environmental temperature.

FIG. 1 illustrates the relation between the frequency deviation of an AT-cut crystal oscillator and the environmental temperature. As shown in FIG. 1, the relation between the output frequency of the AT-cut crystal oscillator and the environmental temperature appears to be a cubic curve such as $f=\alpha T^3+\beta T^2+\gamma T+\delta$. The cubic-curve can be divided into three temperature regions, i.e., low-temperature middle temperature and high-temperature. The cubic curve includes a first linear region of positive slope and a first nonlinear region with an inflection point in the low-temperature region (from −35° C. to +10° C.), a second linear region of negative slope in the middle-temperature region (from +10° C. to +50° C.), and a third linear region of positive slope and a second nonlinear region with an inflection point in the high-temperature region (from +50° C. to +90° C.).

Figure 2:
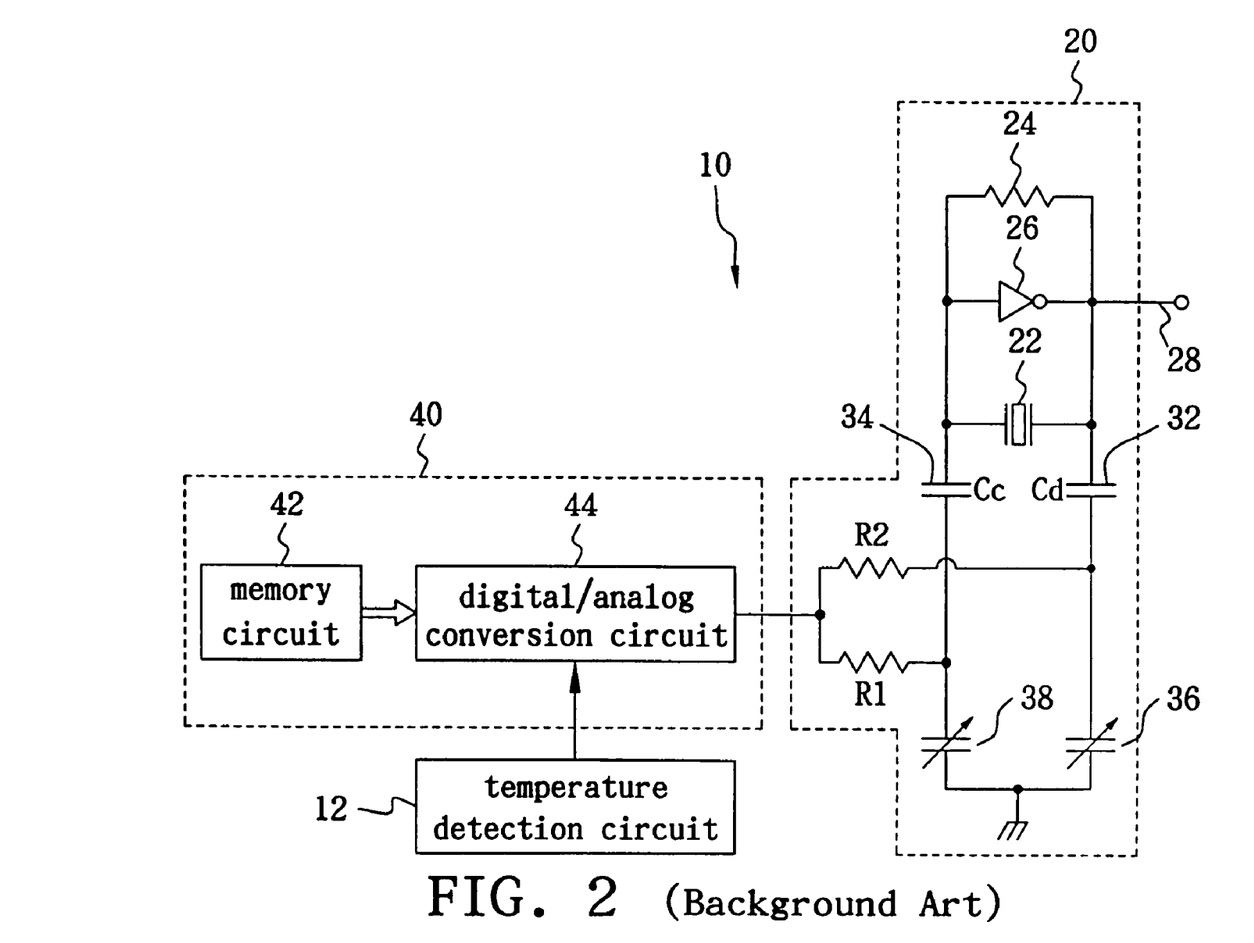
FIG. 2 shows diagrammatic illustration of a circuit of an oscillating device according to the prior art.

FIG. 2 shows a circuit of an oscillating device 10 according to the prior art. As shown in FIG. 2, the oscillating device 10 includes a temperature detection circuit 12, an oscillation circuit 20 and a temperature compensation circuit 40. The oscillation circuit 20 includes an AT-cut crystal oscillator 22, a feedback resistor 24 and an inverter 26 connected to the AT-cut crystal oscillator 22 in parallel. The output port 28 of the oscillating device 10 is pulled out from the output terminal of the inverter 26. The oscillation circuit 20 further includes two DC cut-off capacitors 32, 34 and two variable capacitors 36, 38 connected two terminals of the AT-cut crystal oscillator 22, respectively. The temperature detection circuit 12 uses a thermistor to detect the environmental temperature of the AT-cut crystal oscillator 22, and the temperature compensation circuit 40 maintains the output frequency of the oscillation circuit 20 to a predefined value according to a temperature detection signal from the temperature detection circuit 12.

The temperature compensation circuit 40 includes a memory circuit 42 and a digital/analog conversion circuit 44. The memory circuit 42 is usually composed of the nonvolatile memory to store data required for the temperature compensation, i.e., parameters for describing the cubic curve. According to the compensation data recorded in the memory circuit 42 and the temperature detection signal from the temperature detection circuit 12, the digital/analog conversion circuit 44 outputs a control voltage to the positive electrodes of the variable capacitors 36, 38, respectively, to adjust its oscillation capacitance. Consequently, the oscillation frequency of the oscillation circuit 20 can be controlled and the frequency deviation of the oscillating device 10 can be maintained within an allowable range of the product specification.

Since the AT-cut crystal oscillator 22 is cut mechanically (by laser), the thickness and cutting angle of each AT-cut crystal oscillator 22 are not identical completely each time, which makes its temperature-frequency characteristic different each time. Similarly, the electronic devices of the oscillating device 10 also have characteristic difference originated from the process drifting. In short, the oscillating device 10 is different each time due to the difference of the manufacture procedure, and the temperature-frequency characteristic of each oscillating device 10 is therefore different each time. Therefore, the temperature-frequency characteristic of each oscillating device 10 must be measured in operation temperature regions (high, middle and low temperature regions), and must write the temperature compensation data into the memory circuit 42. However, testing the temperature-frequency characteristic for each oscillating device 10 individually is a very time-consuming work, which results in a dramatic increase in the total testing cost of the oscillating device 10.

BRIEF SUMMARY OF THE INVENTION

The objective of the present invention is to provide a self-calibratable oscillating device, which can shorten the calibration time to lower the total testing cost.

In order to achieve the above-mentioned objective, and avoid the problems of the prior art, the present invention provides a self-calibratable oscillating device, which comprises a phase comparator, a clock pad electrically connected to a first input port of the phase comparator, a crystal oscillator electrically connected to a second input port of the phase comparator, an analog/digital converter electrically connected to an output port of the phase comparator, and a memory electrically connected to an output port of the analog/digital converter. The crystal oscillator can be a temperature-compensated crystal oscillator or a surface acoustic wave crystal oscillator.

The present self-calibratable oscillating device can further comprise a first switch positioned between the first input port of the phase comparator and the clock pad, a second switch positioned between the crystal oscillator and the clock pad wherein the stream direction of the first switch is in reverse of that of the first switch, and a logic control device for controlling the first switch and the second switch. The first switch is turned on and the second switch is turned off when the oscillating device is performing the temperature calibration by itself so that a reference clock can be transmitted to the first input port of the phase comparator via the clock pad. In the contrary, the first switch is turned off and the second switch is turned on when the oscillating device needs to output a clock signal so that the clock of the crystal oscillator can be temperature-compensated and then output via the clock pad.

Compared with the prior art, the present self-calibratable oscillating device can perform a calibration process by itself for the temperature compensation once an activation signal is received, therefore a testing machine can simultaneously perform the calibration process for the temperature compensation of a plurality of self-calibratable oscillating devices connected in parallel by transmitting an activation signal. Since the plurality of the self-calibratable oscillating devices share the calibration time of the testing machine, the calibration time for each self-calibratable oscillating device is shortened to lower the testing cost.

BRIEF DESCRIPTION OF THE SEVERAL VIEWS OF THE DRAWINGS

Other objectives and advantages of the present invention will become apparent upon reading the following descriptions and upon reference to the accompanying drawings.

DETAILED DESCRIPTION OF THE INVENTION

Figure 3:
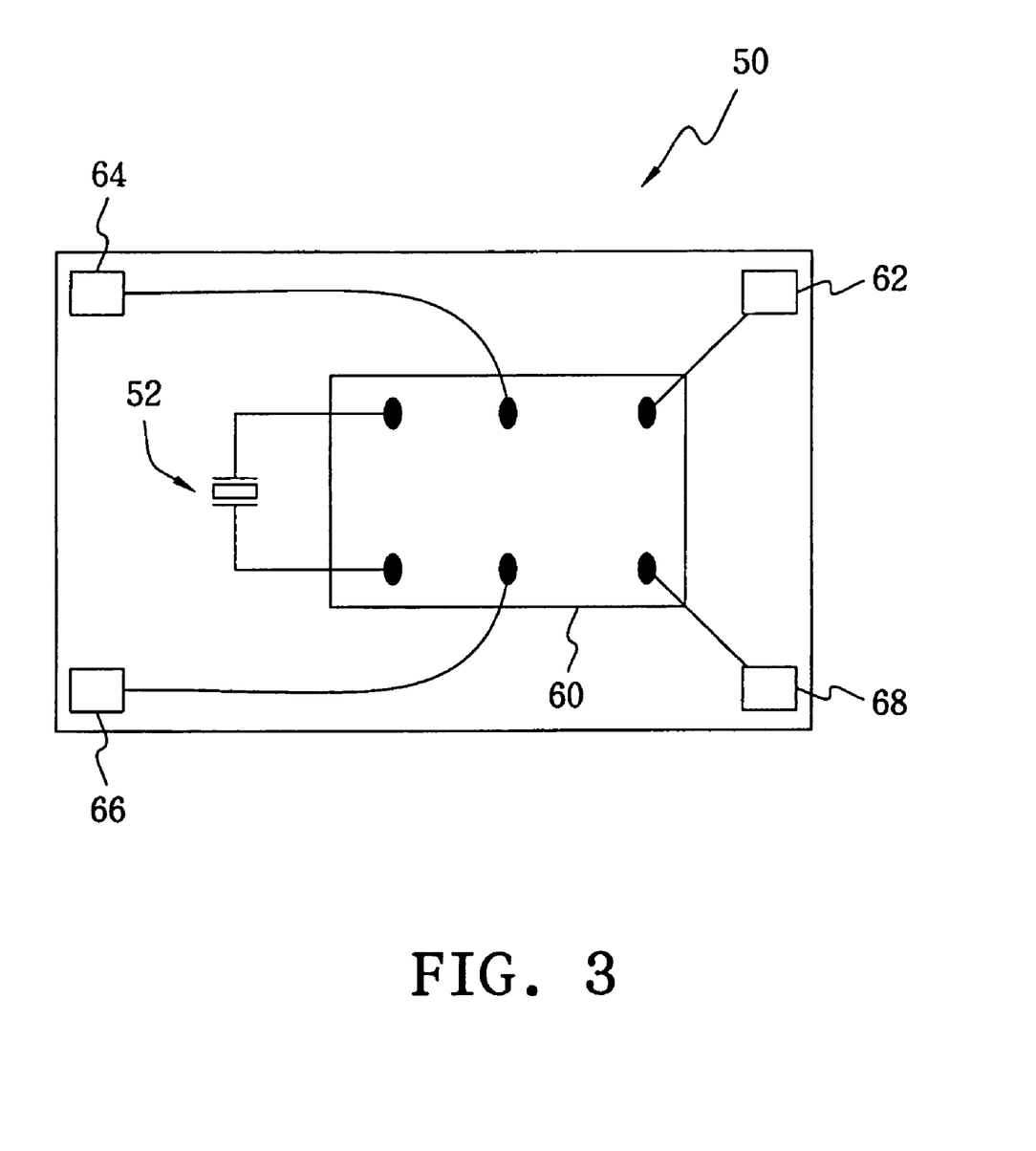
FIG. 3 is a schematic diagram of an oscillating device according to the present invention.

FIG. 3 is a schematic diagram of a self-calibratable oscillating device 50 according to the present invention. As shown in FIG. 3, the self-calibratable oscillating device 50 comprises an AT-cut crystal oscillator 52, an integrated circuit 60 electronically connected to the crystal oscillator 52, a clock signal pad 62, a power pad 64, a ground pad 66 and a control pad 68. The crystal oscillator 52 can be a temperature compensation crystal oscillator or a surface acoustic wave crystal oscillator.

Figure 4:
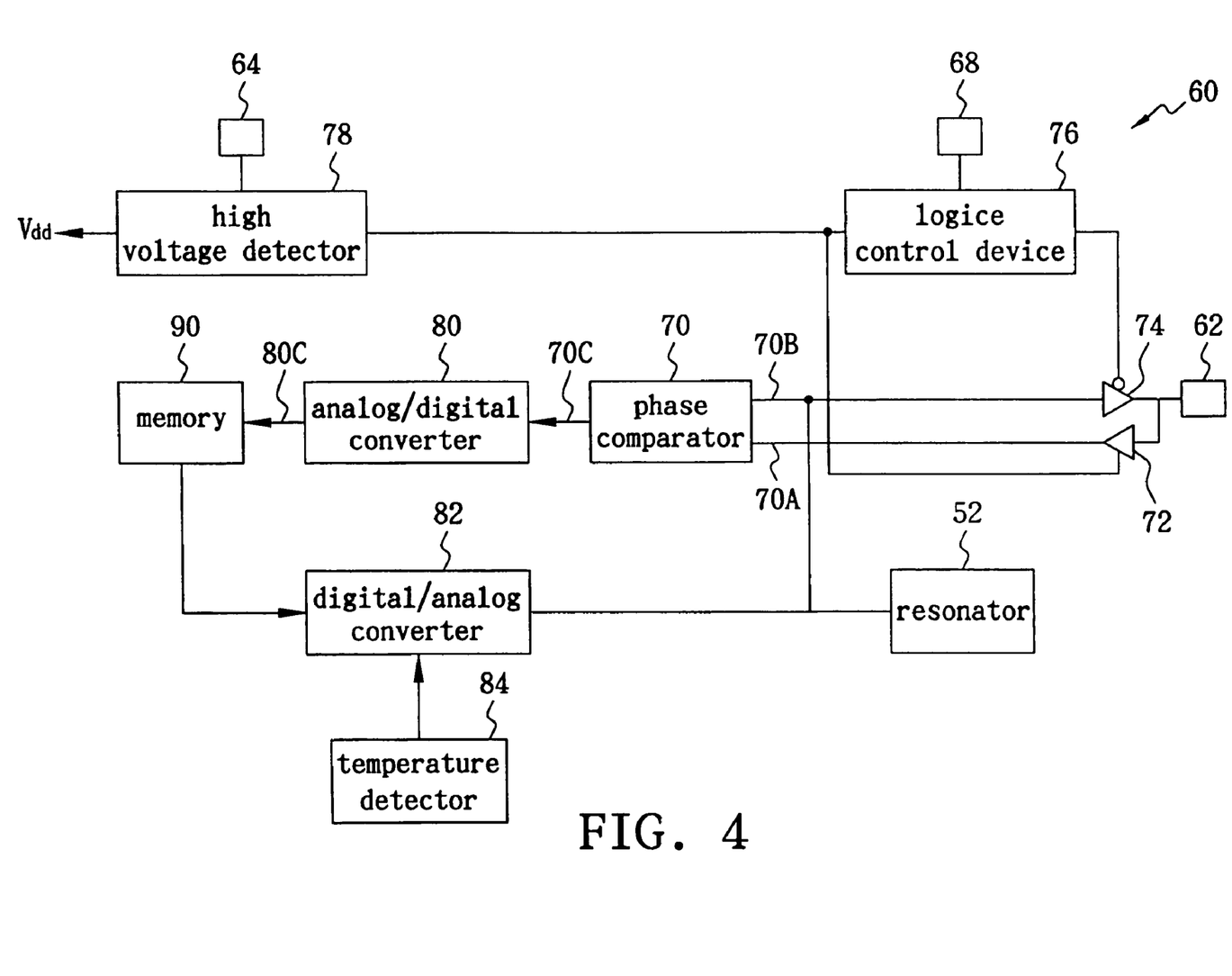
FIG. 4 is a functional block diagram illustration of an integrated circuit according to the present invention.

FIG. 4 is a functional block diagram of the integrated circuit 60 according to the present invention. As shown in FIG. 4, the integrated circuit 60 includes a phase comparator 70, an analog/digital converter 80 electronically connected to an output port 70C of the phase comparator 70, a memory 90 electronically connected to an output port 80C of the analog/digital converter 80, a digital/analog converter 82 electrically connected to the memory 90, and a temperature detector 84 electrically connected to the digital/analog converter 82. The clock signal pad 62 is electronically connected to a first input port 70A of the phase comparator 70, while the crystal oscillator 52 is electronically connected to a second input port 70B of the phase comparator 70. The memory 90 is nonvolatile memory.

The integrated circuit 60 can further include a first switch 72 positioned between the first input port 70A of the phase comparator 70 and the clock signal pad 62, a second switch 74 positioned between the crystal oscillator 52 and the clock signal pad 62, and a logic control device 76 for controlling the first switch 72 and the second switch 74, wherein the stream direction of the second switch 74 is in reverse of that of the first switch 72. The integrated circuit 60 can also include an embedded clock generator such as resistor-capacitor clock generator to generate an internal clock for the logic control device 76, and a high voltage detector 78 electronically connected to the power pad 64 and the logic control device 76.

The logic control device 76 turns on the first switch 72 and turns off the second switch 74 when the oscillating device 50 is performing the temperature calibration by itself so that a testing machine can transmit a reference clock to the first input port 70A of the phase comparator 70 via the clock pad 62. The phase comparator 70 compares the reference clock with the clock of the crystal oscillator 52 and generates a phase difference signal (i.e., frequency deviation signal), and the analog/digital converter 80 then converts the phase difference signal into a digital signal (temperature compensation data), which is then stored in the memory 90 by a pumping circuit.

In the contrary, the logic control device 76 turns off the first switch 72 and turns on the second switch 74 when the oscillating device 50 needs to output a clock signal. The digital/analog converter 82 outputs a control voltage to calibrate the clock of the crystal oscillator 52 according to the temperature compensation data stored in the memory 90 and a temperature detection signal from the temperature detector 84, so that the clock of the crystal oscillator 52 is temperature-compensated and output via the second switch 74 and the clock signal pad 62.

Figure 5:
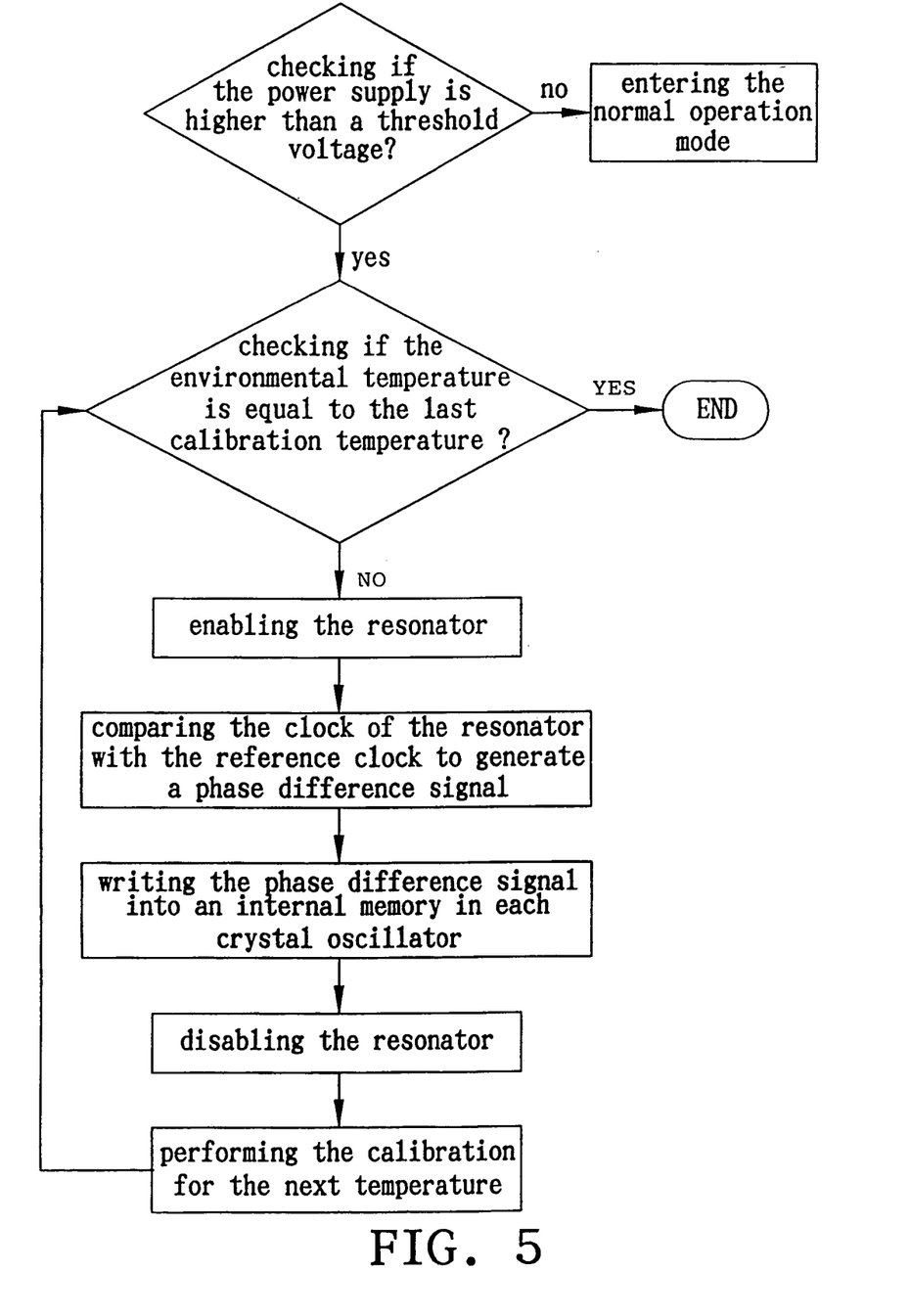
FIG. 5 is a flow chart of an oscillating device according to the present invention.

FIG. 5 is a flow chart showing the method for calibrating oscillating devices according to the present invention. As shown in FIG. 5, the present method first checks if the power supply voltage is higher than a threshold voltage, wherein the threshold voltage can be set to be 120% of the power supply voltage. If the power supply voltage is lower than the threshold voltage, the oscillating device 50 enters the normal operation mode and outputs a temperature-compensated clock. If the power supply voltage is higher than the threshold voltage, the present method then checks if the environmental temperature is equal to the last calibration temperature (generally, the oscillating device needs to be calibrated in three temperature regions, i.e., the low, middle, and high temperature region, respectively). If the environmental temperature is the last calibration temperature, the calibration procedure is terminated according to the present invention. If the environmental temperature is not the last calibration temperature, the crystal oscillator 52 is enabled and a reference clock is input from a testing machine via the clock signal pad 62. The phase comparator 70 compares the reference clock with clock of the crystal oscillator 52 and generates a phase difference signal (i.e., frequency deviation signal). The analog/digital converter 80 converts the frequency deviation signal into a digital signal, which is then stored in the memory 90 by a pumping circuit. The crystal oscillator 52 is then disabled and a next temperature calibration is performed.

Figure 6:
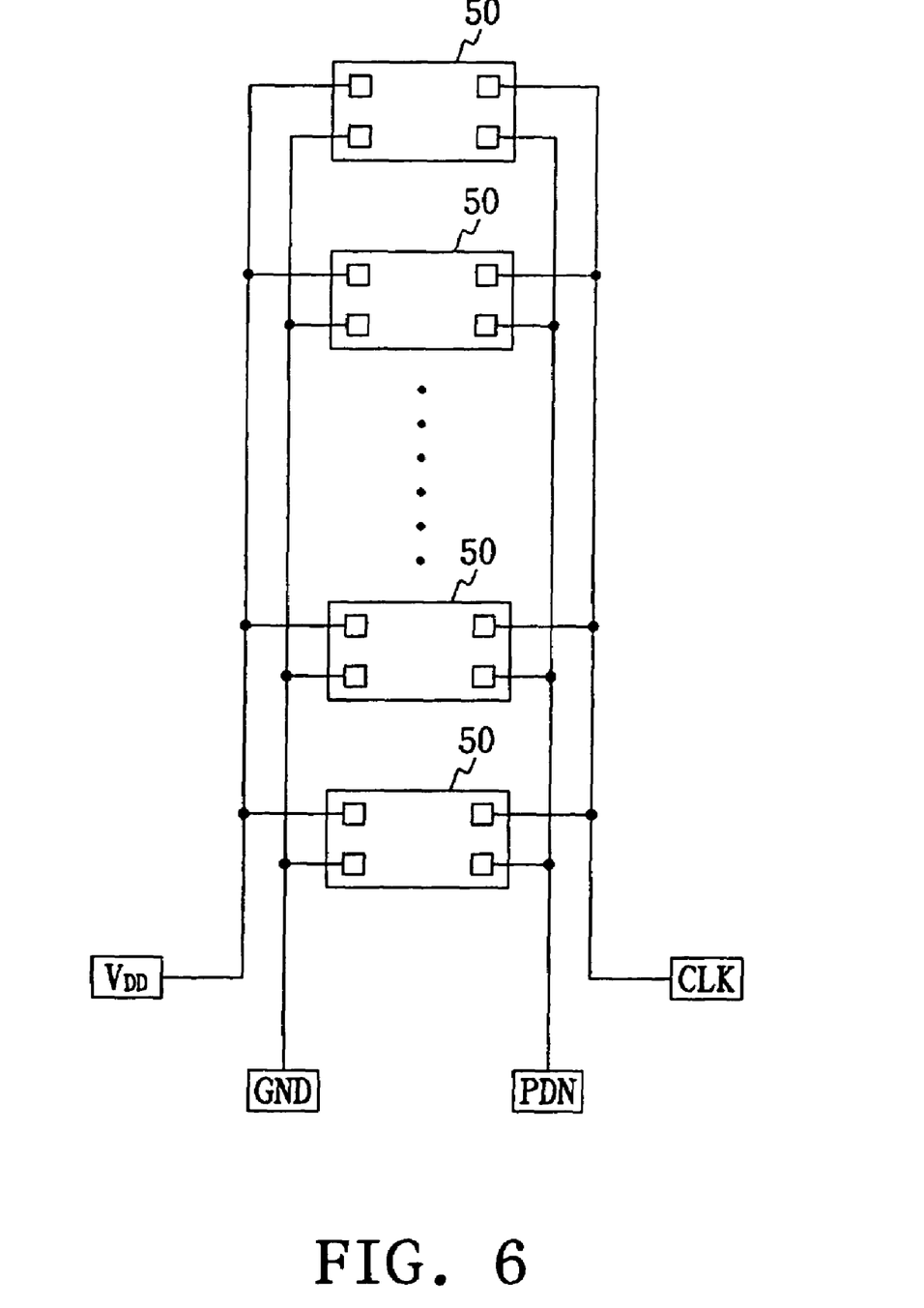
FIG. 6 is a schematic diagram showing a plurality of oscillating devices connected in parallel according to the present invention.

FIG. 6 is a schematic diagram showing a plurality of oscillating devices 50 connected in parallel according to the present invention. The present oscillating device 50 can perform the calibration by itself once an activation signal (a voltage higher than 120% of the power supply voltage) is received. The clock pad (CLK) 62, power supply pad (V$_{DD}$) 64, ground pad (GND) 66 and control pad (PDN) 68 of the plurality of oscillating devices 50 are connected in parallel and a testing machine can input the reference clock from the clock pad 62 and the activation signal from the power supply pad 64 to enable the logic control device 76. Subsequently, the logic control device 76 of each oscillating device 50 can control and perform the temperature calibration procedure automatically, i.e., each oscillating device 50 can perform temperature calibration at the same time (in parallel).

Figure 7:
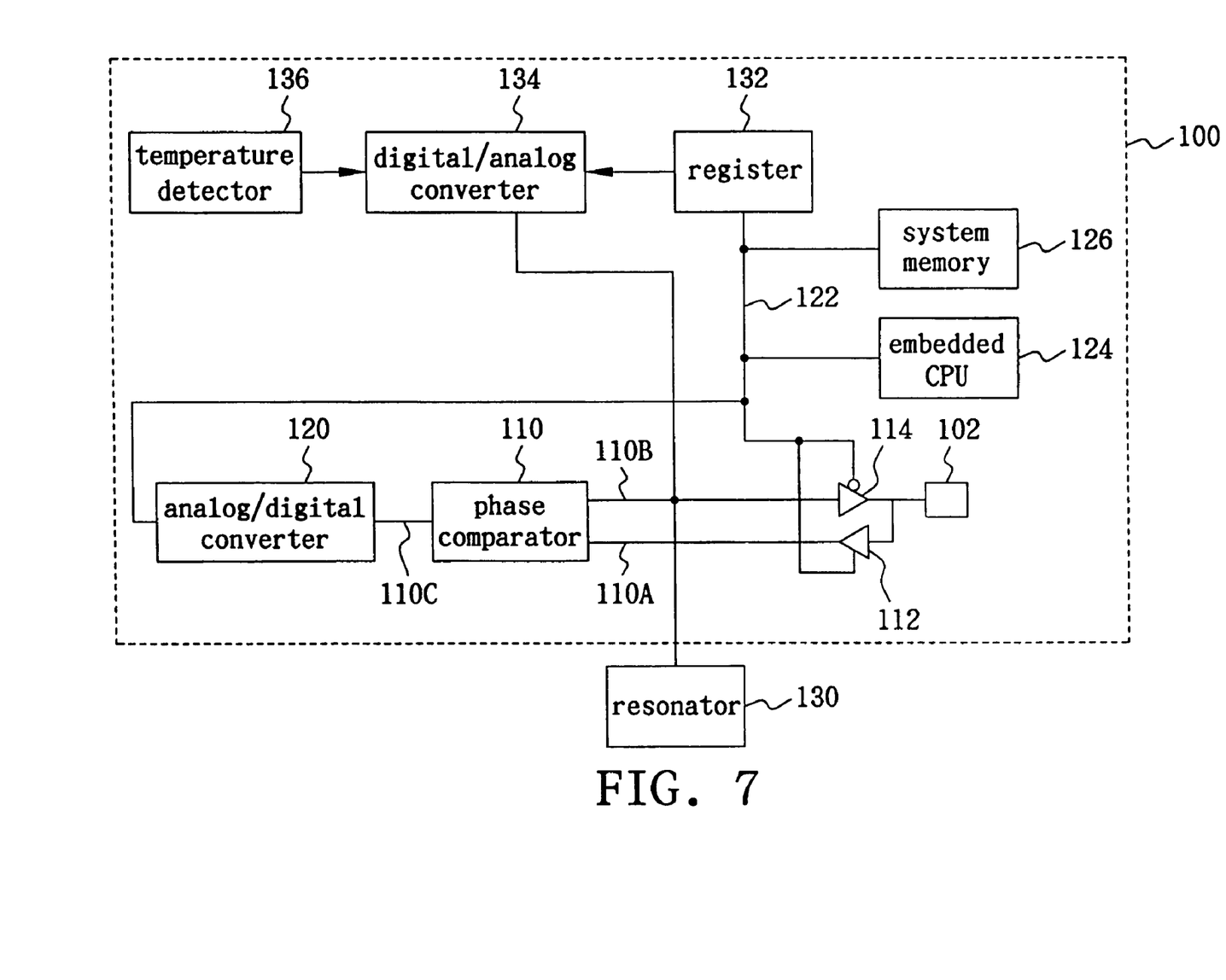
FIG. 7 is a functional block diagram of an ASIC according to the present invention.

FIG. 7 is a functional block diagram of an ASIC (application specific integrated circuit) 100 according to the present invention. As shown in FIG. 7, the ASIC 100 includes a system bus 122, an embedded CPU 124 electronically connected to the system bus 122, a system memory 126 electronically connected to the system bus 122, a clock pad 102, a phase comparator 110 electronically connected to the clock pad 102, an analog/digital converter 120 electronically connected to an output port 110 of the phase comparator. The analog/digital converter 120 is also electronically connected to the system bus 122 to output data to the system memory 124 via the system bus 122. The ASIC 100 further includes a first switch 112 positioned between the first input port 110A of the phase comparator 110 and the clock pad 102, and a second switch 114 positioned between an external crystal oscillator 130 and the clock pad 102.

When the ASIC 100 is performing the temperature calibration for the external crystal oscillator 130, the embedded CPU 124 sends a control instruction through the system bus 122 to turn off the second switch 114 and turn on the first switch 112. A testing machine can then input a reference clock to the first input port 110A of the phase comparator 110 from the clock pad 102 and the first switch 112. The phase comparator 110 compares the reference clock with the clock of the external crystal oscillator 130 and generates a phase difference signal (i.e., frequency deviation signal), and the analog/digital converter 120 converts the frequency deviation signal into a digital signal (temperature compensation data), which is then stored in the system memory 126 through the system bus 122.

In the contrary, when the ASIC 100 needs to output a clock signal, the embedded CPU 124 sends a control instruction through the system bus 122 to turn off the first switch 112 and turn on the second switch 114, and loads the temperature compensation data stored in the system memory 126 into a register 132. The digital/analog converter 134 outputs a control voltage to calibrate the clock of the external crystal oscillator 130 according to the temperature compensation data stored in the register 132 and the temperature detection signal from the temperature detector 136. Therefore, the clock of external crystal oscillator 130 is temperature-compensated and can be output stably through the second switch 114 and the clock pad 102.

Compared with the prior art, the present self-calibratable oscillating device 50 can perform a calibration process by itself for the temperature compensation once an activation signal is received, therefore a testing machine can simultaneously perform the temperature compensation of a plurality of self-calibratable oscillating devices 50 by inputting an activation signal. Since the plurality of the self-calibratable oscillating devices 50 share the calibration time of the testing machine, the calibration time for each self-calibratable oscillating device is shortened to decrease the testing cost.

The above-described embodiments of the present invention are intended to be illustrative only. Numerous alternative embodiments may be devised by those skilled in the art without departing from the scope of the following claims.

What is claimed is:

1. A self-calibratable oscillating device comprising:
   a phase comparator including a first input port, a second input port and an output port;
   a clock pad electrically connected to said first input port;
   a crystal oscillator electrically connected to said second input port;
   an analog/digital converter electrically connected to said output port of said phase comparator, said analog/digital converter having an output end;
   a memory electrically connected to said output end of said analog/digital converter;
   a first switch positioned between said first input port of said phase comparator and said clock pad;
   a second switch positioned between said crystal oscillator and said clock pad, wherein a stream direction of said second switch is in reverse to a stream direction of said first switch; and
   a logic control device for controlling said first switch and said second switch.

2. The self-calibratable oscillating device of claim 1, further comprising:
   a power pad; and
   a high voltage detector electrically connected to said power pad and said logic control device.

3. The self-calibratable oscillating device of claim 1, further comprising:
   an embedded clock generator suitable for providing an operation clock for said logic control device.

4. The self-calibratable oscillating device of claim 3, wherein said embedded clock generator is a resistance-capacitor oscillator.

5. An ASIC for a crystal oscillator comprising:
   a system bus;
   an embedded CPU electrically connected to said system bus;
   a system memory electrically connected to said system bus;
   a clock pad suitable for receiving a reference clock;
   a phase comparing means for generating a phase difference signal between said reference clock and a clock of an oscillating device of the crystal oscillator;
   an analog/digital converting means for converting the phase difference signal into a digital signal;
   a first switch positioned between said phase comparing means and said clock pad; and
   a second switch positioned between the oscillating device and said clock pad.

6. The ASIC for a crystal oscillator of claim 5, further comprising:
   a registering means electrically connected to said system bus, said registering means for storing data of said system memory when said second switch is turned on.

* * * * *